United States Patent
Bloemer et al.

(10) Patent No.: US 11,742,006 B2
(45) Date of Patent: *Aug. 29, 2023

(54) TECHNIQUES FOR PERFORMING COMMAND ADDRESS IN INTERFACE TRAINING ON A DYNAMIC RANDOM-ACCESS MEMORY

(71) Applicant: NVIDIA CORPORATION, Santa Clara, CA (US)

(72) Inventors: Robert Bloemer, Sterling, MA (US); Gautam Bhatia, Mountain View, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/523,778

(22) Filed: Nov. 10, 2021

(65) Prior Publication Data

US 2022/0246183 A1 Aug. 4, 2022

Related U.S. Application Data

(60) Provisional application No. 63/179,954, filed on Apr. 26, 2021, provisional application No. 63/152,817, (Continued)

(51) Int. Cl.
*G11C 7/10* (2006.01)
*H03K 19/21* (2006.01)

(52) U.S. Cl.
CPC ............ *G11C 7/109* (2013.01); *G11C 7/1036* (2013.01); *G11C 7/1063* (2013.01); *H03K 19/21* (2013.01)

(58) Field of Classification Search
CPC ..... G11C 7/109; G11C 7/1036; G11C 7/1063; G11C 7/1093; G11C 11/4093;
(Continued)

(56) References Cited

U.S. PATENT DOCUMENTS 11,416,150 B2 * 8/2022 Kloth ...................... G06F 21/75
2005/0169072 A1 * 8/2005 Ohashi ............. G11C 29/56004
365/201

(Continued)

OTHER PUBLICATIONS

Samsung Electronics Co., Ltd., 8Gb GDDR6 SGRAM C-die, Rev. 1.3, Jan. 2020, 187 pages.

*Primary Examiner* — Sultana Begum
(74) *Attorney, Agent, or Firm* — Artegis Law Group, LLP

(57) ABSTRACT

Various embodiments include a memory device that is capable of performing command address interface training operations, to determine that certain timing conditions are met, with fewer I/O pins relative to prior approaches. Prior approaches for command address interface training involve loading data via a set of input pins, a clock signal, and a clock enable signal that identifies when the input pins should be sampled. Instead, the disclosed memory device generates a data pattern within the memory device that matches the data pattern continuously being transmitted to the memory device by an external memory controller. The memory device compares the generated data pattern with the received data pattern and transmits the result of the comparison on one or more data output pins. The memory controller receives and analyzes the result of the comparison to determine whether the command address interface training passed or failed.

20 Claims, 4 Drawing Sheets

Related U.S. Application Data filed on Feb. 23, 2021, provisional application No. 63/152,814, filed on Feb. 23, 2021, provisional application No. 63/144,971, filed on Feb. 2, 2021.

(58) Field of Classification Search
CPC . G11C 2207/2254; G11C 8/06; G11C 29/023; G11C 29/028; G11C 29/56012; H03K 19/21; G06F 3/061; G06F 3/0629; G06F 3/0673

See application file for complete search history.

(56) References Cited

U.S. PATENT DOCUMENTS

| | | | | |
|---|---|---|---|---|
| 2018/0225270 | A1* | 8/2018 | Bhide | G06F 40/16 |
| 2018/0374555 | A1* | 12/2018 | Kwon | G11C 29/38 |
| 2022/0244863 | A1* | 8/2022 | Bhatia | G06F 3/0619 |
| 2022/0246184 | A1* | 8/2022 | Bhatia | G11C 7/1063 |

\* cited by examiner

TECHNIQUES FOR PERFORMING COMMAND ADDRESS IN INTERFACE TRAINING ON A DYNAMIC RANDOM-ACCESS MEMORY

CROSS-REFERENCE TO RELATED APPLICATIONS

This application claims priority benefit of the U.S. Provisional Patent Application titled, "TECHNIQUES FOR TRANSFERRING COMMANDS TO A DRAM," filed on Feb. 2, 2021 and having Ser. No. 63/144,971. This application further claims priority benefit of the U.S. Provisional Patent Application titled, "DATA SCRAMBLING ON A MEMORY INTERFACE," filed on Feb. 23, 2021 and having Ser. No. 63/152,814. This application further claims priority benefit of the U.S. Provisional Patent Application titled, "DRAM COMMAND INTERFACE TRAINING," filed on Feb. 23, 2021 and having Ser. No. 63/152,817. This application further claims priority benefit of the U.S. Provisional Patent Application titled, "DRAM WRITE TRAINING," filed on Apr. 26, 2021 and having Ser. No. 63/179,954. The subject matter of these related applications are hereby incorporated herein by reference.

BACKGROUND

Field of the Various Embodiments

Various embodiments relate generally to computer memory devices and, more specifically, to techniques for performing command address interface training on a dynamic random-access memory.

Description of the Related Art

A computer system generally includes, among other things, one or more processing units, such as central processing units (CPUs) and/or graphics processing units (GPUs), and one or more memory systems. One type of memory system is referred to as system memory, which is accessible to both the CPU(s) and the GPU(s). Another type of memory system is graphics memory, which is typically accessible only by the GPU(s). These memory systems comprise multiple memory devices. One example memory device employed in system memory and/or graphics memory is synchronous dynamic-random access memory (SDRAM or, more succinctly, DRAM).

Conventionally, a high-speed DRAM memory device employs multiple interfaces. The interfaces include a command address interface for transferring commands and/or memory addresses to the DRAM. Such commands include a command to initiate a write operation, a command to initiate a read operation, and/or the like. The interfaces further include a data interface for transferring data to and from the DRAM, such as during write operations and read operations. In order to reliably transfer commands and data to and from the DRAM, certain timing requirements must be met. One timing requirement is setup time, which defines the minimum amount of time the command or data signals must be stable prior to the clock edge that transfers the command or data signals, respectively. Another timing requirement is hold time, which defines the minimum amount of time the command or data signals must be stable after the clock edge that transfers the command or data signals, respectively. If the setup time requirement or the hold time requirement are not met, then the command and/or data may be transferred with one or more errors, resulting in corrupt command or data information.

As the speed of DRAM memory devices increases, the time between successive clock edges decreases, resulting in a shorter time period within which to meet setup time and hold time requirements. Further, the timing of the clock signal(s), command signals, and data signals are subject to variation due to process variations at the time of manufacture as well as local variations due to changes in operating temperature, supply voltage, interference from other signals, and/or the like. As a result, setup time and hold time requirements are more difficult to meet as DRAM device speeds increase. To mitigate this issue, DRAM memory devices typically have skewing circuits to alter the timing of the command signals and/or data signals relative to the clock signal(s). Periodically, a memory controller associated with the DRAM causes the DRAM to enter a training procedure for command write operations, data write operations, and/or data read operations. During such training procedures, the memory controller changes the skew of one or more command address input pins, data input pins, and/or data output pins until the memory controller determines that the DRAM is reliably performing command write operations, data write operations, and/or data read operations, respectively. The memory controller periodically repeats these training operations periodically as operating conditions change over time, such as changes in operating temperature, supply voltage, and/or the like, in order to ensure reliable DRAM operation.

With particular regard to command address interface training, the memory controller transmits a command address interface training data pattern or, more succinctly, a data pattern, to the DRAM memory device. Typically, the data pattern is a pseudorandom bit sequence that is suitable for detecting errors on particular command address inputs of a DRAM memory device. The DRAM memory device samples the data pattern on a rising edge and/or a falling edge of a clock signal (WCK) received by the memory device when an untrained input called clock enable (CKE) is active. The CKE pin is used to direct the sampling of command address input data patterns in a non-continuous fashion on the command address interface in the DRAM during command address interface training. The DRAM memory device presents the sampled data pattern on the data (DQ) outputs of the memory device. The memory controller then compares the data pattern transmitted to the DRAM memory device by the memory controller with the data pattern received by the memory device via the DQ outputs of the memory device. If the two data patterns match, then the memory controller determines that the command address interface training was successful. If one or more bits of the two data patterns differ, then the memory controller adjusts the relative skew between the CA input pins exhibiting one or more errors. The memory controller iteratively repeats the command address interface training operation and adjusts the skew of command address input pins until the data patterns match. The memory controller then returns the DRAM to normal operation.

One disadvantage of this technique for DRAM command address interface training is that the technique employs a clock enable pin (CKE) input/output (I/O) pin and associated receiver circuit for each DRAM memory device. This additional I/O pin and associated receiver circuit are generally used only during command address interface training but are otherwise unused during normal operation. Notably, certain implementations exist where a single pin is shared between power state transitions and CKE I/O pin use cases.

Even so, although a dedicated I/O pin may be employed to support certain power state transitions, other means exist to support such power state transitions without the use of a particular I/O pin. Therefore, if other means are employed to support power state transitions and other operations, dedicating an additional I/O pin on the DRAM for a clock enable may be disadvantageous. The additional I/O pin and associated receiver circuit increase system cost and complexity. In addition, the additional receiver and I/O pin to receive the clock enable signal are unavailable to accommodate other signals, such as an additional command bit, data bit, or control signal. Further, certain DRAM modules include multiple DRAM devices. In one example, a DRAM module with eight DRAM devices would require eight I/O pins for the clock enable signals that are used during command address interface training but are generally unused during normal operation.

Another disadvantage of this technique is that DRAM memory devices generally require a minimum duration of time between consecutive samples of the command address input pins, because the command address input pins and the data output pins are not yet trained. The clock enable pulse is generally one clock cycle wide, and the timing between consecutive clock enable pulse is limited by this minimum duration of time. Consecutive samples of the command address input pins are thereby delayed in order to reliably perform command address interface training. As a result, command address training is a non-continuous operation, with time lapses between successive samples of the command address input pins. These time lapses lengthen the time needed to complete command address interface training.

As the foregoing illustrates, what is needed in the art are more effective techniques for performing signal training of memory devices.

SUMMARY

Various embodiments of the present disclosure set forth a computer-implemented method for performing a memory interface training operation on a memory device. The method includes receiving a first data pattern on a first input pin of the memory device. The method further includes initializing a first register on the memory device with a second data pattern. The method further includes generating a third data pattern based on the second data pattern in the first register. The method further includes comparing a first portion of the first data pattern with the third data pattern to generate a first results value that indicates whether the memory device received the first portion of the first data pattern correctly. The method further includes transmitting the first results value to a first output of the memory device.

Other embodiments include, without limitation, a system that implements one or more aspects of the disclosed techniques, and one or more computer readable media including instructions for performing one or more aspects of the disclosed techniques, as well as a method for performing one or more aspects of the disclosed techniques.

At least one technical advantage of the disclosed techniques relative to the prior art is that, with the disclosed techniques, no clock enable (CKE) pin is needed to perform command address interface training. As a result, a receiver and I/O pin are no longer needed to receive the clock enable signal. As a result, the complexity of the internal circuitry, the surface area, and power consumption of the DRAM die may be reduced relative to approaches involving a clock enable pin. Further, the I/O pin previously employed to receive the clock enable signal is available for another function, such as an additional command bit, data bit, or control signal. Another advantage of the disclosed techniques is that command address interface training is performed in a continuous manner without gaps between consecutive captures of the command address input pins. Therefore, command address interface training is performed in less time relative to prior approaches. These advantages represent one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

System Overview

Figure 1:
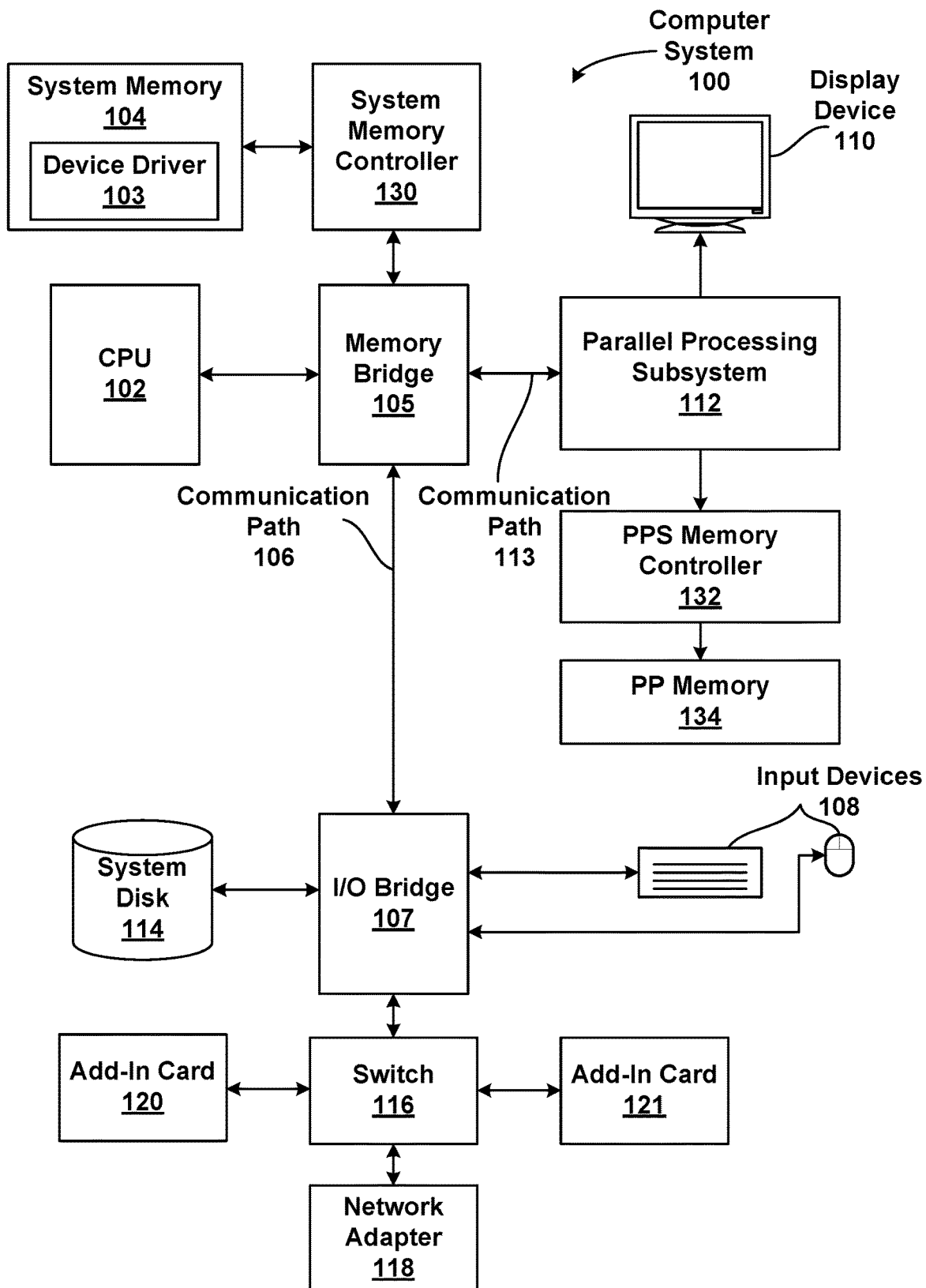
FIG. 1 is a block diagram of a computer system configured to implement one or more aspects of the various embodiments.

FIG. 1 is a block diagram of a computer system 100 configured to implement one or more aspects of the various embodiments. As shown, computer system 100 includes, without limitation, a central processing unit (CPU) 102 and a system memory 104 coupled to a parallel processing subsystem 112 via a memory bridge 105 and a communication path 113. Memory bridge 105 is coupled to system memory 104 via a system memory controller 130. Memory bridge 105 is further coupled to an I/O (input/output) bridge 107 via a communication path 106, and I/O bridge 107 is, in turn, coupled to a switch 116. Parallel processing subsystem 112 is coupled to parallel processing memory 134 via a parallel processing subsystem (PPS) memory controller 132.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high-definition DVD), or other magnetic, optical, or solid-state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, and/or the like. In such embodiments, parallel processing subsystem 112 incorporates circuitry optimized for graphics and video processing, including, for example, video output circuitry. Such circuitry may be incorporated across one or more parallel processing units (PPUs) included within parallel processing subsystem 112. In some embodiments, each PUPS comprises a graphics processing unit (GPU) that may be configured to implement a graphics rendering pipeline to perform various operations related to generating pixel data based on graphics data supplied by CPU 102 and/or system memory 104. Each PPU may be implemented using one or more integrated circuit devices, such as programmable processors, application specific integrated circuits (ASICs), or memory devices, or in any other technically feasible fashion.

In some embodiments, parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more other elements of FIG. 1 to form a single system. For example, parallel processing subsystem 112 may be integrated with CPU 102 and other connection circuitry on a single chip to form a system on chip (SoC).

In operation, CPU 102 is the master processor of computer system 100, controlling and coordinating operations of other system components. In particular, CPU 102 issues commands that control the operation of PPUs within parallel processing subsystem 112. In some embodiments, CPU 102 writes a stream of commands for PPUs within parallel processing subsystem 112 to a data structure (not explicitly shown in FIG. 1) that may be located in system memory 104, PP memory 134, or another storage location accessible to both CPU 102 and PPUs. A pointer to the data structure is written to a pushbuffer to initiate processing of the stream of commands in the data structure. The PPU reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

Each PPU includes an I/O (input/output) unit that communicates with the rest of computer system 100 via the communication path 113 and memory bridge 105. This I/O unit generates packets (or other signals) for transmission on communication path 113 and also receives all incoming packets (or other signals) from communication path 113, directing the incoming packets to appropriate components of the PPU. The connection of PPUs to the rest of computer system 100 may be varied. In some embodiments, parallel processing subsystem 112, which includes at least one PPU, is implemented as an add-in card that can be inserted into an expansion slot of computer system 100. In other embodiments, the PPUs can be integrated on a single chip with a bus bridge, such as memory bridge 105 or I/O bridge 107. Again, in still other embodiments, some or all of the elements of the PPUs may be included along with CPU 102 in a single integrated circuit or system of chip (SoC).

CPU 102 and PPUs within parallel processing subsystem 112 access system memory via a system memory controller 130. System memory controller 130 transmits signals to the memory devices included in system memory 104 to initiate the memory devices, transmit commands to the memory devices, write data to the memory devices, read data from the memory devices, and/or the like. One example memory device employed in system memory 104 is double-data rate SDRAM (DDR SDRAM or, more succinctly, DDR). DDR memory devices perform memory write and read operations at twice the data rate of previous generation single data rate (SDR) memory devices.

In addition, PPUs and/or other components within parallel processing subsystem 112 access PP memory 134 via a parallel processing system (PPS) memory controller 132. PPS memory controller 132 transmits signals to the memory devices included in PP memory 134 to initiate the memory devices, transmit commands to the memory devices, write data to the memory devices, read data from the memory devices, and/or the like. One example memory device employed in PP memory 134 synchronous graphics random access memory (SCRAM), which is a specialized form of SDRAM for computer graphics applications. One particular type of SCRAM is graphics double-data rate SCRAM (GDDR SDRAM or, more succinctly, GDDR). Compared with DDR memory devices, GDDR memory devices are configured with a wider data bus, in order to transfer more data bits with each memory write and read operation. By employing double data rate technology and a wider data bus, GDDR memory devices are able to achieve the high data transfer rates typically needed by PPUs.

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

It will be appreciated that the core architecture described herein is illustrative and that variations and modifications are possible. Among other things, the computer system 100 of FIG. 1, may include any number of CPUs 102, parallel processing subsystems 112, or memory systems, such as system memory 104 and parallel processing memory 134, within the scope of the disclosed embodiments. Further, as used herein, references to shared memory may include any one or more technically feasible memories, including, without limitation, a local memory shared by one or more PPUs within parallel processing subsystem 112, memory shared between multiple parallel processing subsystems 112, a cache memory, parallel processing memory 134, and/or system memory 104. Please also note, as used herein, references to cache memory may include any one or more technically feasible memories, including, without limitation, an L1 cache, an L1.5 cache, and L2 caches. In view of the foregoing, persons of ordinary skill in the art will appreciate that the architecture described in FIG. 1 in no way limits the scope of the various embodiments of the present disclosure.

Performing a Command Address Interface Training Operation on a DRAM

Various embodiments are directed to techniques for efficiently performing command address interface training of a DRAM memory device. The disclosed techniques reduce the DRAM pin overhead by eliminating the CKE pin and instead train the command address (CA) interface with a continuous PRBS (pseudo-random binary sequence) pattern. A memory controller transmits a CA training entry command to the DRAM to ensure that the DRAM correctly enters the CA training mode. Once in CA training mode, a per CA-pin checker is used to compare the incoming CA PRBS pattern with a LFSR (linear feedback shift register) output that has been initialized with a start value.

In some embodiments, the DRAM initializes the LFSR with a predetermined seed value. Additionally or alternatively, the DRAM initializes the LFSR with a seed value that has been transmitted by the memory controller to the DRAM. In these latter embodiments, the memory controller transmits the seed value to the DRAM via the command address interface when the command address interface is operating at a lower frequency that does not require interface training. In some embodiments, the DRAM initializes the LFSR by self-seeding. To self-seed, when the DRAM begins a training sequence, the DRAM loads the LFSR with a portion of the initial PRBS sequence being received from the memory controller. Thereafter, the output of the LFSR is checked against the remaining PRBS sequence being received from the memory controller.

The DRAM presents the pass/fail result of the comparison between the LFSR output and the data pattern from the memory controller by transmitting the pass/fail result on the DQ (data) pins of the DRAM. The DRAM transmits the pass/fail result in an asynchronous fashion that allows the memory controller to reliably sample the result information without requiring the DQ pins to have been trained. Based on the result of the comparison, the memory controller may cause adjustments to be made on the memory controller and/or the DRAM to alter the transmission and reception of signals on the command address interface. Thereafter, the memory controller may reinitiate the CA training periodically to ensure that the command address interface is operating as desired or to make further adjustments to the command address interface.

Figure 2:
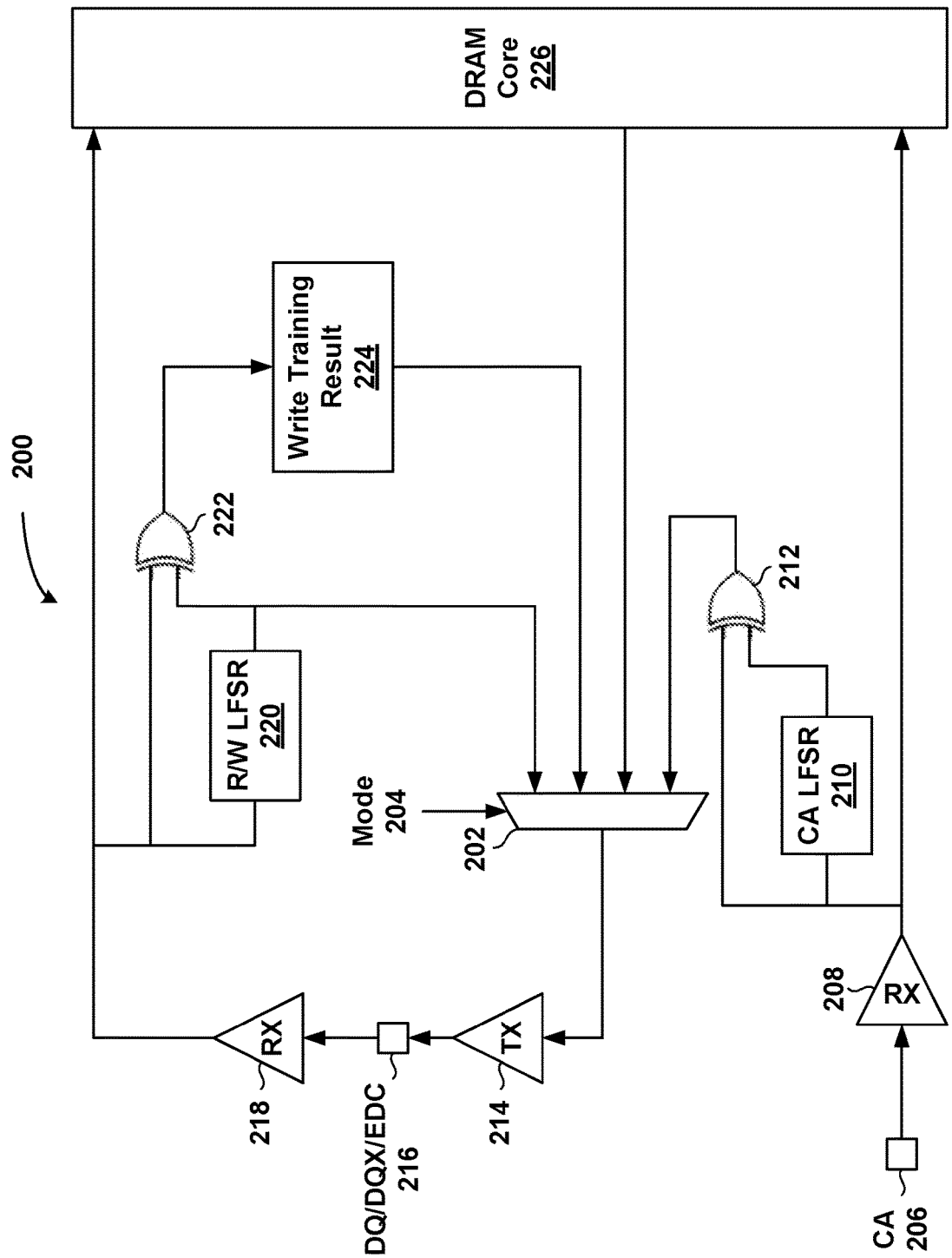
FIG. 2 is a block diagram of a training architecture for a memory device included in system memory and/or parallel processing memory of the computer system of FIG. 1, according to various embodiments.

FIG. 2 is a block diagram of a training architecture 200 for a memory device included in system memory 104 and/or parallel processing memory 134 of the computer system of FIG. 1, according to various embodiments. As further described, the training architecture 200 includes components for command address interface training, data read interface training, and data write interface training. Via these components, the training architecture 200 performs command address training operations, data read training operations, and data write training operations without the need to store training data in the DRAM core 226 of the memory device. When operating the memory device at higher speeds, the memory controller, such as system memory controller 130 and/or PPS memory controller 132, periodically performs these training operations in order to meet setup time and hold time on all of the input pins and output pins of the memory device.

In general, the memory controller performs training operations in a particular order. First, the memory controller performs training operations on the command address interface. By training the command address interface first, the memory device is ready to receive commands and write mode registers as needed to perform data read interface training, and data write interface training. In general, the command address interface functions without training as long as setup time and hold time are met on all command address (CA) input pins 206. The memory controller causes a seed value and/or polynomial to be loaded into the command address linear feedback shift register (CA LFSR) 210. The memory controller applies a data pattern to one or more CA input pins 206. The CA input pins 206 are transmitted via receiver 208 to the CA LFSR 210 and to exclusive-or (XOR) gate 212. The CA LFSR 210 replicates the same pattern as the memory controller. The XOR gate 212 compares the data pattern on the CA input pins 206 with the data from the CA LFSR 210. The XOR gate 212 transmits a low value if the data pattern on the CA input pins 206 match the data from the CA LFSR 210. The XOR gate 212 transmits a high value if the data pattern on the CA input pins 206 does not match the data from the CA LFSR 210. The mode 204 input to multiplexor 202 selects the bottom input to transmit the output of the XOR gate 212 to transmitter 214 and then to one or more data (DQ), extended data (DQX), and/or error detection and correction (EDC) pins 216. The memory controller then reads the one or more DQ, DQX, and/or EDC pins 216 to determine whether the command address input training was successful. Once the command address input training completes, command addresses received from the memory controller pass through CA input pins 206 and receiver 208 and then to the DRAM core 226.

Second, the memory controller performs training operations on the data read interface. In general, training operations on the data read interface are performed before training operations on the data write interface. This order of training operations ensures that read data is correct from the memory device, which allows the memory controller to perform optimal write training operations. The memory controller causes a seed value and/or polynomial to be loaded into the read/write linear feedback shift register (R/W LFSR) 220. The mode 204 input to multiplexor 202 selects the second from the top input to transmit the output of the R/W LFSR 220 to transmitter 214 and then to one or more data (DQ), extended data (DQX), and/or error detection and correction (EDC) pins 216. The memory controller then reads the one or more DQ, DQX, and/or EDC pins 216 to determine whether the received data is the expected pattern from the R/W LFSR 220.

Third, the memory controller performs training operations on the data write interface. The memory controller causes a seed value and/or polynomial to be loaded into the R/W LFSR 220. The memory controller applies a data pattern to one or more DQ, DQX, and/or EDC pins 216. The DQ, DQX, and/or EDC pins 216 are transmitted via receiver 218 to the R/W LFSR 220 and to exclusive-or (XOR) gate 222. The R/W LFSR 220 replicates the same pattern as the memory controller. The XOR gate 222 compares the data pattern on the DQ, DQX, and/or EDC pins 216 with the data from the R/W LFSR 220. The XOR gate 222 transmits a low value if the data pattern on the CA input pins 206 match the data from the R/W LFSR 220. The XOR gate 222 transmits a high value if the data pattern on the DQ, DQX, and/or EDC pins 216 does not match the data from the R/W LFSR 220. The output of the XOR gate 222 is transmitted to the write training result register 224 and stored as pass/fail write training status for each of the DQ, DQX, and/or EDC pins 216 undergoing write training. The memory controller reads the write training result register 224 to determine the results of the write training operations. When the memory controller reads the write training result register 224, the mode 204 input to multiplexor 202 selects the second from the top input to transmit the output of the write training result register 224 through transmitter 214 and then to one or more DQ, DQX, and/or EDC pins 216. The memory controller then reads the one or more DQ, DQX, and/or EDC pins 216 to determine whether the data write training was successful. Once the data write training completes, write data received from the memory controller pass through DQ, DQX, and/or EDC pins 216 and receiver 218 and then to the DRAM core 226.

Once the data read training and data write training completes, the mode 204 input to multiplexor 202 selects the second from the bottom input to transmit the output of the DRAM core 226 to transmitter 214 and then to one or more data (DQ), extended data (DQX), and/or error detection and correction (EDC) pins 216.

Returning to command address interface training, the DRAM generally does not know when command address interface training is needed. Instead, the memory controller determines whether and when to initiate command address interface training. The memory controller can cause the DRAM to enter command address interface training via a number of different techniques.

In some examples, the memory controller applies a fixed pattern to one or more CA input pins 206 when the power is initially applied to the DRAM and/or when a reset is transmitted to the DRAM. During power-up and/or reset of the DRAM, the memory controller applies a low voltage to a reset input of the memory device, placing the memory device in a reset state. Subsequently, the memory controller applies a high voltage to the reset input of the memory device in order to bring the memory device out of the reset state. Prior to applying the high voltage to the reset input, the memory controller may apply a fixed bit pattern to the CA input pins 206 of the DRAM. This fixed bit pattern is referred to herein as straps. The memory device samples the state of the straps on the rising edge of the reset signal to determine the value of the fixed bit pattern. Based on the fixed bit pattern, the DRAM enters a command address interface training 316 operation.

In some examples, the DRAM may detect a self-refresh exit command and/or power-on exit command received asynchronously when the DRAM exits a low-power state, such as an idle state or a self-refresh state, and/or the like. Because the memory controller transmits the self-refresh exit command and/or power-on exit command to the DRAM asynchronously, the DRAM is able to detect the command even without an active clock signal, when the command address interface is not trained, and/or when the command address interface is not currently executing synchronously with respect to the clock signal. For example, the memory controller could transmit a signal to the DRAM on a first CA input pin 206 that transitions from one state to another state (e.g., high to low state or low to high state) to command the DRAM to exit the low-power state. During the time of the transition of this signal, the memory controller applies a high level or a low level to a second CA input pin 206 to indicate whether the DRAM enters a command address training operation. If the second CA input pin 206 is at one level at the time of the transition of the first CA input pin 206, then the DRAM enters the command address training operation. If the second CA input pin 206 is at another level at the time of the transition of the first CA input pin 206, then the DRAM does not enter the command address training operation.

In some examples, the memory controller may transmit a command to the DRAM to load a register in the DRAM, such as a mode register, with a particular value that includes a command to enter a command address training operation. The memory controller transmits the command to the DRAM when the command address interface is trained or when the command address interface is operating at a sufficiently low operating speed that training is not needed. When the DRAM subsequently enters and then exits a low-power state, such as an idle state, a self-refresh state, and/or the like, the DRAM reads the mode register. If the value in the mode register includes a command to enter command address interface training, then the DRAM enters the command address training operation. If the value in the mode register does not include a command to enter command address interface training, then the DRAM does not enter the command address training operation.

Upon entry into the command address training operation, the DRAM enters a first mode (mode 1) of command address training. In mode 1, the memory controller and DRAM test setup time and hold time for each command address input pin 206 independently. The circuitry for each command address input pin 206 includes a CA LFSR 210 that generates a pseudo-random bit sequence (PRBS). The circuitry for each command address input pin 206 further includes a PRBS checker, such as XOR gate 212, that compares the PRBS generated by CA LFSR 210 with a PRBS received from the memory controller via receiver 208.

The memory controller transmits a known, predetermined PRBS to one or more CA input pins 206 that are being trained. By design, the memory controller and CA LFSR 210 generate the same PRBS. The PRBS may be in any technically feasible format, such as a 15-bit PRBS, a 7-bit PRBS, and/or the like. Further, the PRBS may be based on any technically feasible seed value and/or polynomial. Each CA LFSR 210 corresponding to each CA input pin 206 may be loaded with the same seed value and/or polynomial. Additionally or alternatively, different CA LFSRs 210 corresponding to different CA input pins 206 may be loaded with the different seed values and/or polynomials. The memory controller synchronizes with CA LFSR 210 by commanding CA LFSR 210 to load a seed value via one of several possible techniques.

In some embodiments, the DRAM initializes CA LFSR 210 with a predetermined seed value. Additionally or alternatively, the DRAM initializes CA LFSR 210 with a seed value that has been transmitted by the memory controller to the DRAM. In these latter embodiments, the memory controller transmits the seed value to the DRAM via the command address interface pins 206 when the command address interface is operating at a lower frequency that does not require interface training. Whether the DRAM initializes CA LFSR 210 with a predetermined seed value or with a seed value received from the memory controller, the memory controller begins transmitting the PRBS based on the seed value once the memory controller has confirmed that the DRAM has initialized CA LFSR 210 with the correct seed value. Thereafter, the memory controller transmits a PRBS to each CA input pin 206 being tested. The corresponding CA LFSR 210 generates the same PRBS as the PRBS received by the memory controller.

In some embodiments, the DRAM initializes CA LFSR 210 by self-seeding. To self-seed, the memory controller begins to transmit a PRBS to one or more CA input pins 206 at any starting point in the PRBS. The memory controller and DRAM operate with the same polynomial but do not need to start with the same seed value. The DRAM begins a command address interface training sequence by loading the CA LFSR 210 with an initial portion of the initial PRBS sequence being received from the memory controller via the corresponding CA input pin 206. The data sampled on each CA input pins 206 is stored in the respective CA LFSR 210 for the CA input pin 206. Thereafter, the current data in CA LFSR 210 is used to generate the next part of the PRBS transmitted by CA LFSR 210, according to the polynomial. Initially, during the self-seeding process, CA LFSR 210 may store a value of all zeros, all ones, or a random value. As a result, the PRBS from the memory controller may or may not match the PRBS from CA LFSR 210. Therefore, XOR gate 212 may transmit incorrect pass/fail status to multiplexor 202. After some number of clock cycles, the self-seeding process for CA LFSR 210 is complete.

Thereafter, the PRBS output of CA LFSR 210 is checked against the remaining PRBS being received from the memory controller. If the PRBS received from the memory controller is sampled correctly, CA LFSR 210 generates the same expected PRBS, and XOR gate 212 transmits a pass result. The DRAM asynchronously transits the pass result to the memory controller via the DQ/DQX/EDC output pins 216. Although the DRAM may transmit a pass result value or fail result value to the DQ/DQX/EDC output pins 216 during self-seeding, the DQ/DQX/EDC outputs 216 transition to transmitting a pass result value once self-seeding is complete. The memory controller receives data asynchronously via the DQ/DQX/EDC output pins 216 and analyzes the data to determine that the mode 1 command address interface training operation resulted in a pass result value. If one or more of the DQ/DQX/EDC output pins 216 indicates a fail result value, then the memory controller adjusts the skew between the corresponding CA input pin 206 and the clock signal until a pass result value is consistently received for all CA input pins 206. The memory controller continues to perform mode 1 command address interface training operations to determine the optimal point for each CA input pin 206 with respect to setup time and hold time.

In some embodiments, during the self-seeding process when the CA LFSR 210 is not fully seeded, the DRAM may force a fail status on the output of all PRBS checkers, such as XOR gate 212. The DRAM forces the fail status until some number of clock cycles has occurred and CA LFSRs 210 for all CA input pins 206 are fully bootstrapped and loaded with complete seed values. For example, for a 15-bit PRBS pattern, the DRAM forces the fail status for 15 clock cycles until the 15-bit CA LFSRs 210 are fully loaded with respective seed values. In this manner, the DRAM does not transmit false pass results to the memory controller when CA LFSRs 210 are being loaded with seed values. With this approach, the memory controller is relieved of the need to ignore the first outputs of the XOR gate 212 when first entering mode 1 command address interface testing. After the CA LFSRs 210 are fully loaded with respective seed values, the DRAM stops forcing a fail status on the outputs of the XOR gates 212. The DRAM transitions to a check state where status transmitted to the memory controller via the DQ, DQX, and/or EDC pin 216 reflect the output of the corresponding XOR gates 212. Therefore, the DQ, DQX, and/or EDC pin 216 now indicate the correct pass/fail state of the corresponding XOR gates 212, which is now checking the output of each CA LFSR 210 with the incoming data received from the memory controller via the corresponding CA input pin 206.

After the completion of mode 1, each CA input pin 206 is individually trained with respect to setup time and hold time relative to the clock signal. However, sampling points for different CA input pins 206 may occur at different edges of the clock signal. Consequently, the DRAM may sample certain CA input pins 206 on one edge of the clock signal and other CA input pins 206 at a previous edge of the clock signal and/or a subsequent edge of the clock signal. As a result, when the memory controller transmits a set of signals to the CA input pins 206 of the DRAM, the DRAM may sample a portion of the signals on one edge of the clock signal and another portion of the signals on one or more different edges of the clock signal. This condition is referred to as multicycle skew. To correct for this issue, the memory controller transitions the DRAM from mode 1 of command address interface training to a second mode (mode 2) of command address interface training.

The memory controller causes the DRAM to transition from mode 1 to mode 2 by transmitting a pattern to one or more CA input pins 206 that does not occur in the PRBS. In some examples, a 15-bit PRBS does not generate a series of 15 zeroes in a row. Therefore, the memory controller can cause the DRAM to transition from mode 1 to mode 2 by transmitting a pattern of 15 consecutive zero values to one or more CA input pins 206. Additionally or alternatively, the memory controller can cause the DRAM to transition from mode 1 to mode 2 by transmitting any pattern to one or more CA input pins 206 that does not occur in the PRBS. When the DRAM detects the pattern, the DRAM determines that the pattern is not part of the PRBS but is instead a command. In response, the DRAM transitions from mode 1 to mode 2.

In mode 2, the memory controller and DRAM test for multicycle skew among the command address input pins 206 as a group. The memory controller and DRAM test for multicycle skew via one of two sub-modes within mode 2.

In a first sub-mode of mode 2, a single CA input pin 206 is used as a reference pin for all CA input pins 206. The PRBS generated by CA LFSR 210 for the single reference pin is used to compare against the patterns received from the memory controller on all other CA input pins 206. In some embodiments, this structure is achieved via a multiplexor. In such embodiments, in mode 1, the multiplexor routes the XOR gate 212 for each CA input pin 206 to the CA LFSR 210 for that CA input pin 206. In mode 2, the multiplexor instead routes the XOR gate 212 for each CA input pin 206 to the CA LFSR 210 for the reference CA input pin 206. As a result, in mode 2, each XOR gate 212 compares the PRBS received from the memory controller for the corresponding CA input pin 206 with the PRBS generated by the CA LFSR 210 for the reference CA input pin 206. The CA LFSR 210 for the reference pin is seeded via any of the techniques described herein.

For CA input pins 206 that correctly sample the PRBS from the memory controller on the correct edge of the clock signal, the corresponding XOR gate 212 transmits a pass result to the corresponding DQ, DQX, and/or EDC pin 216. For a CA input pin 206 that incorrectly samples the PRBS from the memory controller on a different edge of the clock signal, the corresponding XOR gate 212 transmits a fail result to the corresponding DQ, DQX, and/or EDC pin 216. The fail result occurs when multicycle skew causes the PRBS received from the memory controller via the CA input pin 206 does not match the PRBS generated by CA LFSR 210 of the reference point on at least some edges of the clock signal. When the memory controller detects a fail status on one or more DQ, DQX, and/or EDC pins 216, the memory controller skews the output data for the corresponding CA input pins 206 by one or more clock cycles. The memory controller repeats the test and skews CA input pins 206 until each CA input pin 206 reliable captures the PRBS from the memory controller.

In a second sub-mode of mode 2, a single CA input pin 206 receives a data pattern from the memory controller via the corresponding receiver 208. The circuitry for each CA input pin 206 captures the incoming data pattern and transmits the captured data pattern asynchronously on the corresponding DQ, DQX, and/or EDC pins 216. In this sub-mode, the memory controller compares the data pattern received from the DRAM via the DQ, DQX, and/or EDC pins 216 with the data pattern transmitted to the DRAM via the CA input pins 206. If one or more DQ, DQX, and/or EDC pins 216 does not present the correct value, the memory controller skews the output data for the corresponding CA input pins 206 by one or more clock cycles. The memory controller repeats the test and skews CA input pins 206 until each CA input pin 206 reliable captures the PRBS from the memory controller.

In the second sub-mode of mode 2, the DRAM is not performing any data pattern checking, but rather is returning the data captured via the CA input pins 206 to the DQ, DQX, and/or EDC pins 216. The memory controller is performing the data pattern checking in this sub-mode. Therefore, in this sub-mode, the memory controller may transmit any technically feasible data pattern to the CA input pins 206 including, without limitation, a PRBS, a predetermined non-PRBS pattern, a walking ones pattern, a walking zeros pattern, and/or the like. Additionally or alternatively, the memory controller may transmit any data pattern to the CA input pins 206, based on any one or more predetermined, user-defined patterns, to the CA input pins 206. More generally, in this sub-mode, the memory controller may transmit any technically feasible data pattern to the CA input pins 20.

When mode 2 testing is complete, the memory controller causes the DRAM to transition out of CA training mode to normal operation mode. The memory controller causes the DRAM to transition from mode 2 to normal operation mode by transmitting a pattern to one or more CA input pins 206 that does not occur in the PRBS. In some examples, a 15-bit PRBS does not generate a series of 15 zeroes in a row. Therefore, the memory controller can cause the DRAM to transition from mode 2 to normal operation mode by transmitting a pattern of 15 consecutive zero values to one or more CA input pins 206. Additionally or alternatively, the memory controller can cause the DRAM to transition from mode 2 to normal operation mode transmitting any pattern to one or more CA input pins 206 that does not occur in the PRBS. When the DRAM detects the pattern, the DRAM determines that the pattern is not part of the PRBS but is instead a command. In response, the DRAM transitions from mode 2 to normal operation mode. The CA input pins are now trained, and the DRAM is now ready to receive commands from the memory controller.

It will be appreciated that the system shown herein is illustrative and that variations and modifications are possible. Among other things, the training architecture 200 includes components for command address interface training, data read interface training, and data write interface training. However, the training architecture 200 may include components for training any other technically feasible input and/or output interface within the scope of the present disclosure.

Figure 3:
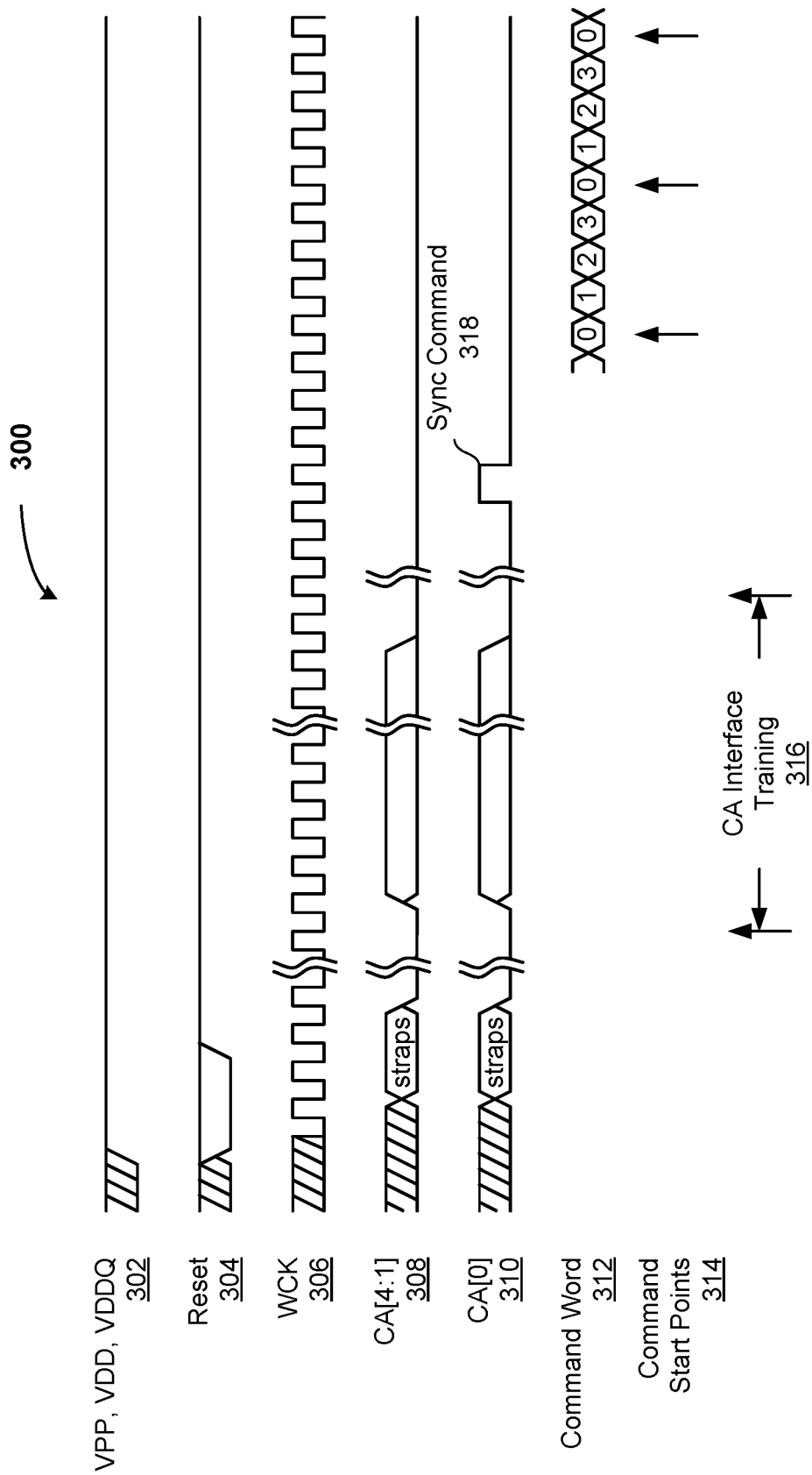
FIG. 3 is a timing diagram illustrating the initialization of the memory device included in system memory and/or parallel processing memory of the computer system of FIG. 1 to receive commands, according to various embodiments.

FIG. 3 is a timing diagram 300 illustrating the initialization of the memory device included in system memory 104 and/or parallel processing memory 134 of the computer system of FIG. 1 to receive commands, according to various embodiments.

The memory device employs a single clock signal scheme that captures both command and data. The rate of the clock signal is determined by the transfer rate of the highest speed interface of the memory device. Typically, the data interface transfers data at a higher rate than the command address interface. However, in some embodiments, the command address interface may transfer data at a higher rate than the data interface. The rate of the clock signal rate is set at the transfer rate of the highest speed interface, such as the data interface. This clock signal is employed to transfer data to and from the memory device, typically at a rate of one data transfer per clock cycle.

This clock signal is further employed to transfer commands, at a lower transfer rate, to the memory device. More specifically, commands are transferred to the memory device over multiple clock cycles of the high-speed clock signal, such as over four clock cycles. The high-speed clock signal is labeled WCK 306 and illustrates the timing of the WCK 306 I/O pin of FIG. 2. The command address interface includes any number of I/O pins for transferring the command to the memory device, including the CA input pins 206 of FIG. 2. In some embodiments, the command address interface includes five I/O pins, labeled CA[4:0], shown separately as CA[4:1] 308 and CA[0] 310 command I/O pins.

In some embodiments, each command transferred over four clock cycles of the WCK 306. The references to 0, 1, 2, and 3 represent the four phases of a command word 312. A full command word 312 is transferred to the memory device over four cycles of WCK 306, over a consecutive series of clock cycles 0, 1, 2, and 3. Therefore, a complete command includes up to 4 clock cycles×6 bits per clock cycle=24 bits. Each full command word 312 represents a command to be performed by the memory device, such as a write operation, a read operation, an activate operation, and/or the like.

In order to synchronize transfer of commands to the memory device, the memory controller, such as system memory controller 130 or parallel processing subsystem (PPS) memory controller 132, transmits a synchronization (sync) command 318 to the memory device prior to transferring commands to the memory device. The synchronization command 318 indicates the valid command start points 314 for transferring commands, that is, which clock edge corresponds to the first portion of the multi-cycle command. At certain times, the memory device loses synchronization and does not know which clock cycles are valid command start points 314. For example, the memory device loses synchronization when powered up, when recovering from a reset, when recovering from a low-power state, such as an idle state or a self-refresh state, and/or the like. In such cases, the memory controller transmits a synchronization command 318 to the memory device that enforces a new command start point 314 and synchronizes the memory device with the memory controller. Once synchronized, the memory device may begin accepting commands from the memory controller.

More specifically, the memory device may power up when VPP, VDD, and VDDQ 302 are applied to the memory device, where VPP is the pump voltage, VDD is the main power supply voltage, and VDDQ is the I/O voltage. The memory controller applies a low voltage to the reset 304 input of the memory device, placing the memory device in a reset state. Subsequently, the memory controller applies a high voltage to the reset 304 input of the memory device in order to bring the memory device out of the reset state. Prior to applying the high voltage to the reset 304 input, the memory controller may apply a fixed bit pattern to the CA[4:1] 308 and CA[0] 310 command I/O pins of the memory device. This fixed bit pattern is referred to herein as "straps." The memory device samples the state of the straps on the rising edge of reset 304 to determine the value of the fixed bit pattern. Based on the fixed bit pattern, the memory device may undergo certain startup procedures, such as a command address (CA) interface training 316 operation to command the memory device to determine the skew between WCK 306 and the CA[4:1] 308 and CA[0] 310 command I/O pins. The memory controller completes the startup procedures, such as the CA interface training 316 operation, via an asynchronous communication sequence with the memory device. The CA interface training 316 operation determines an optimal skew of the CA[4:1] 308 and CA[0] 310 command I/O pins with respect to WCK 306 to ensure that setup time and hold time requirements are met for the [4:1] 308 and CA[0] 310 command I/O pins. The CA interface training 316 operation further detects and corrects any multiple cycle skewing between any two or more command I/O pins to ensure that all command I/O pins are capturing command bits for the same command word 312 on the same rising or falling edge of WCK 306.

After completion of the CA interface training 316 operation, the memory device is in a state where commands may be received synchronously with respect to rising edges and/or falling edges of WCK 306. Alternatively, if the memory controller and memory device did not perform the CA interface training 316 operation, then the memory device is ready to receive commands synchronously any time after the rising edge of reset 304. In either case, the memory controller transmits a synchronization command 318 to the memory device prior to transferring commands to the memory device on one of the command I/O pins, shown in FIG. 3 as the CA[0] 310 command I/O pin. When the memory device receives the synchronization command 318, the memory device counts a number of rising edges or falling edges of WCK 306 from either the leading edge or the trailing edge of the synchronization command 318. In some examples, the memory device counts four rising edges of WCK 306 after the trailing edge of the synchronization command 318 to determine the first command start point 314. The memory controller, in turn, applies phase 0 of the first command word 312 to the CA[4:1] 308 and CA[0] 310 command I/O pins. The memory controller applies phase 0 of the first command word 312 so as to be valid at the fourth rising edge of WCK 306 after the trailing edge of the synchronization command 318. The memory controller applies phases 1, 2, and 3 of the first command word 312 so as to be valid at the consecutive rising edges of WCK 306. The memory device samples the four phases of the first command word 312 on the CA[4:1] 308 and CA[0] 310 on these same four rising edges of WCK 306. The first rising edge of WCK 306 after phase 3 of the first command word 312 represents a second command start point 314. The memory controller applies, and the memory device transfers, the four phases 0, 1, 2, 3 of the second command word 312 on four successive rising edges of WCK 306 starting with the second command start point 314. The first rising edge of WCK 306 after phase 3 of the second command word 312 represents a third command start point 314, and so on.

In some embodiments, the memory device may recover from an idle state, a self-refresh state, and/or the like without undergoing a reset 304 or a full power down and power up of VPP, VDD, VDDQ 302. In such cases, the memory device may perform a CA interface training 316 operation via a mechanism other than strapping pin values. In some examples, the memory device may enter a CA interface training 316 operation via a received asynchronous command without assertion of a reset 304 or a full power down and power up of VPP, VDD, VDDQ 302. With this asynchronous procedure, the memory device may remove power from receivers and transmitters of all I/O pins, including WCK 306, except for a receiver for one or more I/O pins of the memory device involved in the asynchronous procedure. When recovering from the idle state or self-refresh state, the memory controller applies, and the memory device searches for, a particular value on the one or more I/O pins of the memory device with an active receiver. For example, the memory device may keep the receiver for the CA[0] 310 command I/O pin and/or one or more receivers for the CA[4:1] 308 command I/O pins active during idle or self-refresh states. When recovering from the idle or self-refresh state, the memory controller may apply, and the memory device may detect, certain values on the CA[0] 310 command I/O pin and/or one or more CA[4:1] 308 command I/O pins. These values on the CA[0] 310 command I/O pin and/or one or more CA[4:1] 308 command I/O pins may command the memory device to enter a CA interface training 316 operation.

In some examples, the memory controller may transmit a command to the memory device synchronously during a time when the command address interface is trained or is operating at a sufficiently slow speed that training is unnecessary. The memory controller transmits the command to the memory device prior to causing the memory device to enter an idle state, a self-refresh state, and/or the like. The memory device stores the command in a register, such as a mode register, included in the memory device. When the memory device subsequently recovers from the idle state, the self-refresh state, and/or the like, the memory device reads the mode register to determine if the mode register stores a command to enter a CA interface training 316 operation.

In response, to either the asynchronous command or mode register command, the memory device begins a CA interface training 316 operation. Advantageously, this asynchronous procedure and the mode register procedure allow the memory controller to train the command address interface of the memory device without incurring the latency and penalty of performing a full power-down/power-up sequence. Instead, the memory device resumes operation with the memory controller quickly when recovering from a low-power state, such as an idle state, a self-refresh state, and/or the like.

Figure 4:
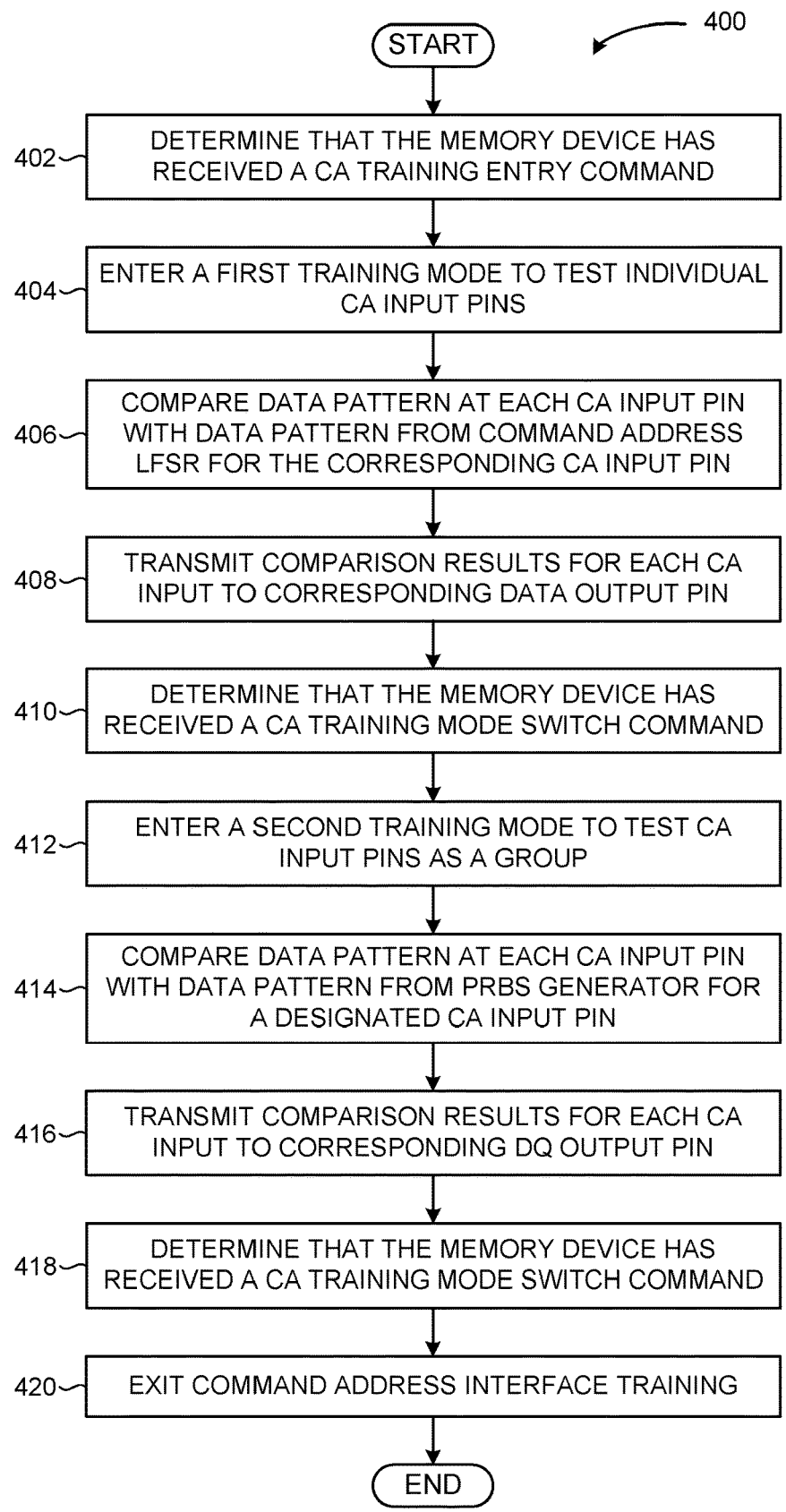
FIG. 4 is a flow diagram of method steps for performing a write training operation on a memory device included in system memory and/or parallel processing memory of the computer system of FIG. 1, according to various embodiments.

FIG. 4 is a flow diagram of method steps for performing a command address interface training operation on a memory device included in system memory 104 and/or parallel processing memory 134 of the computer system of FIG. 1, according to various embodiments. Although the method steps are described in conjunction with the systems of FIGS. 1-3, persons of ordinary skill in the art will understand that any system configured to perform the method steps, in any order, is within the scope of the present disclosure.

As shown, a method 400 begins at step 402, where a memory device determines that the memory device has received a command address (CA) training entry command. The memory controller can cause the DRAM to enter command address interface training via a number of different techniques. In some examples, the memory controller applies a fixed pattern to one or more CA input pins 206 when the power is initially applied to the DRAM and/or when a reset is transmitted to the DRAM. This fixed bit pattern is referred to herein as straps. The memory device samples the state of the straps on the rising edge of the reset signal to determine the value of the fixed bit pattern. Based on the fixed bit pattern, the DRAM enters a command address interface training 316 operation. In some examples, the DRAM may detect a self-refresh exit command and/or power-on exit command received asynchronously when the DRAM exits a low-power state, such as an idle state or a self-refresh state, and/or the like. In some examples, the memory controller may transmit a command to the DRAM to load a register in the DRAM, such as a mode register, with a particular value that includes a command to enter a command address training operation. The memory controller transmits the command to the DRAM when the command address interface is trained or when the command address interface is operating at a sufficiently low operating speed that training is not needed. When the DRAM subsequently enters and then exits a low-power state, such as an idle state, a self-refresh state, and/or the like, the DRAM reads the mode register and enters the command address training operation, based on the value stored in the mode register.

At step 404, the memory device enters a first training mode to test individual CA input pins 206. Upon entry into the command address training operation, the DRAM enters a first mode (mode 1) of command address training. In mode 1, the memory controller and DRAM test setup time and hold time for each command address input pin 206 independently. The circuitry for each command address input pin 206 includes a CA LFSR 210 that generates a pseudo-random bit sequence (PRBS). The circuitry for each command address input pin 206 further includes a PRBS checker, such as XOR gate 212, that compares the PRBS generated by CA LFSR 210 with a PRBS received from the memory controller via receiver 208.

At step 406, the memory device compares the data pattern received at each CA input pin 206 with the data pattern generated by each CA LFSR 210 for the corresponding CA input pin 206. At step 408, the memory device transmits the comparison results for each CA input pin 206 to the corresponding data pins, such as DQ, DQX, and/or EDC pins 216. In performing steps 406 and 408, the PRBS output of CA LFSR 210 is checked against the PRBS being received from the memory controller. If the PRBS received from the memory controller is sampled correctly, CA LFSR 210 generates the same expected PRBS, and XOR gate 212 transmits a pass result. The DRAM asynchronously transits the pass result to the memory controller via the DQ/DQX/EDC output pins 216. Although the DRAM may transmit a pass result value or fail result value to the DQ/DQX/EDC output pins 216 during self-seeding, the DQ/DQX/EDC outputs 216 transition to transmitting a pass result value once self-seeding is complete. The memory controller receives data asynchronously via the DQ/DQX/EDC output pins 216 and analyzes the data to determine that the mode 1 command address interface training operation resulted in a pass result value. If one or more of the DQ/DQX/EDC output pins 216 indicates a fail result value, then the memory controller adjusts the skew between the corresponding CA input pin 206 and the clock signal until a pass result value is consistently received for all CA input pins 206. The memory controller continues to perform mode 1 command address interface training operations to determine the optimal point for each CA input pin 206 with respect to setup time and hold time.

At step 410, the memory device determines that the memory device has received a training mode switch command. After the completion of mode 1, each CA input pin 206 is individually trained with respect to setup time and hold time relative to the clock signal. However, sampling points for different CA input pins 206 may occur at different edges of the clock signal. Consequently, the DRAM may sample certain CA input pins 206 on one edge of the clock signal and other CA input pins 206 at a previous edge of the clock signal and/or a subsequent edge of the clock signal. As a result, when the memory controller transmits a set of signals to the CA input pins 206 of the DRAM, the DRAM may sample a portion of the signals on one edge of the clock signal and another portion of the signals on one or more different edges of the clock signal. This condition is referred to as multicycle skew. To correct for this issue, the memory controller transitions the DRAM from mode 1 of command address interface training to a second mode (mode 2) of command address interface training.

The memory controller causes the DRAM to transition from mode 1 to mode 2 by transmitting a pattern to one or more CA input pins 206 that does not occur in the PRBS. In some examples, a 15-bit PRBS does not generate a series of 15 zeroes in a row. Therefore, the memory controller can cause the DRAM to transition from mode 1 to mode 2 by transmitting a pattern of 15 consecutive zero values to one or more CA input pins 206. Additionally or alternatively, the memory controller can cause the DRAM to transition from mode 1 to mode 2 by transmitting any pattern to one or more CA input pins 206 that does not occur in the PRBS. When the DRAM detects the pattern, the DRAM determines that the pattern is not part of the PRBS but is instead a command. In response, the DRAM transitions from mode 1 to mode 2.

At step 412, the memory device enters a second training mode (mode 2) to test CA input pins 206 as a group. In mode 2, the memory controller and DRAM test for multicycle skew among the command address input pins 206 as a group. The memory controller and DRAM test for multicycle skew via one of two sub-modes within mode 2. At step 414, the memory device compares the data pattern at each CA input pin 206 with a data pattern from an LFSR, such as a CA LFSR 210, for a designated CA input pin 206. In mode 2, a single CA input pin 206 is used as a reference pin for all CA input pins 206. The PRBS generated by CA LFSR 210 for the single reference pin is used to compare against the patterns received from the memory controller on all other CA input pins 206. In some embodiments, this structure is achieved via a multiplexor. In such embodiments, in mode 1, the multiplexor routes the XOR gate 212 for each CA input pin 206 to the CA LFSR 210 for that CA input pin 206. In mode 2, the multiplexor instead routes the XOR gate 212 for each CA input pin 206 to the CA LFSR 210 for the reference CA input pin 206. As a result, in mode 2, each XOR gate 212 compares the PRBS received from the memory controller for the corresponding CA input pin 206 with the PRBS generated by the CA LFSR 210 for the reference CA input pin 206. The CA LFSR 210 for the reference pin is seeded via any of the techniques described herein.

At step 416, the memory device transmits the comparison results for each CA input pin 206 to a corresponding DQ, DQX, and/or EDC pin 216. For CA input pins 206 that correctly sample the PRBS from the memory controller on the correct edge of the clock signal, the corresponding XOR gate 212 transmits a pass result to the corresponding DQ, DQX, and/or EDC pin 216. For a CA input pin 206 that incorrectly samples the PRBS from the memory controller on a different edge of the clock signal, the corresponding XOR gate 212 transmits a fail result to the corresponding DQ, DQX, and/or EDC pin 216. The fail result occurs when multicycle skew causes the PRBS received from the memory controller via the CA input pin 206 does not match the PRBS generated by CA LFSR 210 of the reference point on at least some edges of the clock signal. When the memory controller detects a fail status on one or more DQ, DQX, and/or EDC pins 216, the memory controller skews the output data for the corresponding CA input pins 206 by one or more clock cycles. The memory controller repeats the test and skews CA input pins 206 until each CA input pin 206 reliable captures the PRBS from the memory controller.

At step 418, the memory device determines that the memory device has received a training mode switch command. When mode 2 testing is complete, the memory controller causes the DRAM to transition out of CA training mode to normal operation mode. The memory controller causes the DRAM to transition from mode 2 to normal operation mode by transmitting a pattern to one or more CA input pins 206 that does not occur in the PRBS. In some examples, a 15-bit PRBS does not generate a series of 15 zeroes in a row. Therefore, the memory controller can cause the DRAM to transition from mode 2 to normal operation mode by transmitting a pattern of 15 consecutive zero values to one or more CA input pins 206. Additionally or alternatively, the memory controller can cause the DRAM to transition from mode 2 to normal operation mode transmitting any pattern to one or more CA input pins 206 that does not occur in the PRBS.

At step 420, the memory device exits command address interface training. When the DRAM detects the pattern that does not occur in the PRBS, the DRAM determines that the pattern is not part of the PRBS but is instead a command. In response, the DRAM transitions from mode 2 to normal operation mode. The CA input pins are now trained, and the DRAM is now ready to receive commands from the memory controller.

The method 400 then terminates. Alternatively, the method 400 proceeds to step 402 to perform additional command address input training operations.

In sum, various embodiments are directed to techniques for efficiently performing command address interface training of a DRAM memory device. The disclosed techniques reduce the DRAM pin overhead by eliminating the CKE pin and instead train the command address (CA) interface with a continuous PRBS (pseudo-random binary sequence) pattern. A memory controller transmits a CA training entry command to the DRAM to ensure that the DRAM correctly enters the CA training mode. Once in CA training mode, a per CA-pin checker is used to compare the incoming CA PRBS pattern with a LFSR (linear feedback shift register) output that has been initialized with a start value.

In some embodiments, the DRAM initializes the LFSR with a predetermined seed value. Additionally or alternatively, the DRAM initializes the LFSR with a seed value that has been transmitted by the memory controller to the DRAM. In these latter embodiments, the memory controller transmits the seed value to the DRAM via the command address interface when the command address interface is operating at a lower frequency that does not require interface training. In some embodiments, the DRAM initializes the LFSR by self-seeding. To self-seed, when the DRAM begins a training sequence, the DRAM loads the LFSR with a portion of the initial PRBS sequence being received from the memory controller. Thereafter, the output of the LFSR is checked against the remaining PRBS sequence being received from the memory controller.

The DRAM presents the pass/fail result of the comparison between the LFSR output and the data pattern from the memory controller by transmitting the pass/fail result on the DQ (data) pins of the DRAM. The DRAM transmits the pass/fail result in an asynchronous fashion that allows the memory controller to reliably sample the result information without requiring the DQ pins to have been trained. Based on the result of the comparison, the memory controller may cause adjustments to be made on the memory controller and/or the DRAM to alter the transmission and reception of signals on the command address interface. Thereafter, the memory controller may reinitiate the CA training periodically to ensure that the command address interface is operating as desired or to make further adjustments to the command address interface.

At least one technical advantage of the disclosed techniques relative to the prior art is that, with the disclosed techniques, no clock enable (CKE) pin is needed to perform command address interface training. As a result, a receiver and I/O pin are no longer needed to receive the clock enable signal. As a result, the complexity of the internal circuitry, the surface area, and power consumption of the DRAM die may be reduced relative to approaches involving a clock enable pin. Further, the I/O pin previously employed to receive the clock enable signal is available for another function, such as an additional command bit, data bit, or control signal. Another advantage of the disclosed techniques is that command address interface training is performed in a continuous manner without gaps between consecutive captures of the command address input pins. Therefore, command address interface training is performed in less time relative to prior approaches. These advantages represent one or more technological improvements over prior art approaches.

Any and all combinations of any of the claim elements recited in any of the claims and/or any elements described in this application, in any fashion, fall within the contemplated scope of the present disclosure and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for performing a memory interface training operation on a memory device, the method comprising:
    receiving a first data pattern on a first input pin of the memory device;
    initializing a first register on the memory device with a second data pattern;
    generating, by the memory device, a third data pattern based on the second data pattern in the first register in the memory device;
    comparing, by the memory device, a first portion of the first data pattern with the third data pattern to generate a first results value that indicates whether the memory device received the first portion of the first data pattern correctly; and
    transmitting the first results value to a first output of the memory device.

2. The computer-implemented method of claim 1, wherein the second data pattern comprises a predetermined value.

3. The computer-implemented method of claim 1, wherein the second data pattern comprises a second portion of the first data pattern.

4. The computer-implemented method of claim 1, further comprising:
    determining that the first portion of the first data pattern matches the third data pattern,
    wherein the first results value indicates a pass result.

5. The computer-implemented method of claim 1, further comprising:
    determining that the first portion of the first data pattern does not match the third data pattern,
    wherein the first results value indicates a fail result.

6. The computer-implemented method of claim 1, further comprising:
    receiving a fourth data pattern on the first input pin and on a second input pin of the memory device;
    initializing the first register on the memory device with a fifth data pattern;
    generating, via the first register, a sixth data pattern based on the fifth data pattern;
    comparing a first portion of the fourth data pattern received at the first input pin with the sixth data pattern to generate a second results value;

comparing the first portion of the fourth data pattern received at the second input pin with the sixth data pattern to generate a third results value;

transmitting the second results value to the first output of the memory device; and transmitting the third results value to a second output of the memory device.

7. The computer-implemented method of claim 1, wherein comparing the first portion of the first data pattern with the third data pattern comprises performing an exclusive-or (XOR) operation on first portion of the first data pattern with the third data pattern.

8. The computer-implemented method of claim 7, wherein the first results value is based on an output of the XOR operation.

9. The computer-implemented method of claim 1, wherein initializing the first register on the memory device with the second data pattern comprises:

receiving an initial value from a memory controller; and
storing the initial value in the first register.

10. The computer-implemented method of claim 1, wherein the first register comprises a linear feedback shift register.

11. The computer-implemented method of claim 1, wherein at least one of the first data pattern or the second data pattern comprises a pseudorandom bit sequence.

12. A system, comprising:
a memory controller; and
a memory device coupled to the memory controller, and that:
  receives, via the memory controller, a first data pattern on a first input pin of the memory device;
  initializes a first register on the memory device with a second data pattern;
  generates a third data pattern based on the second data pattern in the first register in the memory device;
  compares a first portion of the first data pattern with the third data pattern to generate a first results value that indicates whether the memory device received the first portion of the first data pattern correctly; and
  transmits the first results value to a first output of the memory device.

13. The system of claim 12, wherein the second data pattern comprises a predetermined value.

14. The system of claim 12, wherein the second data pattern comprises a second portion of the first data pattern.

15. The system of claim 12, wherein the memory device further:

determines that the first portion of the first data pattern matches the third data pattern, wherein the first results value indicates a pass result.

16. The system of claim 12, wherein the memory device further:

determines that the first portion of the first data pattern does not match the third data pattern, wherein the first results value indicates a fail result.

17. The system of claim 12, wherein the memory device further:

receives a fourth data pattern on the first input pin and on a second input pin of the memory device;

initializes the first register on the memory device with a fifth data pattern;

generates, via the first register, a sixth data pattern based on the fifth data pattern;

compares a first portion of the fourth data pattern received at the first input pin with the sixth data pattern to generate a second results value;

compares the first portion of the fourth data pattern received at the second input pin with the sixth data pattern to generate a third results value;

transmits the second results value to the first output of the memory device; and transmits the third results value to a second output of the memory device.

18. The system of claim 12, wherein the memory device compares the first portion of the first data pattern with the third data pattern by performing an exclusive-or (XOR) operation on first portion of the first data pattern with the third data pattern.

19. The system of claim 18, wherein the first results value is based on an output of the XOR operation.

20. The system of claim 12, wherein the memory device initializes the first register on the memory device with the second data pattern by:

receiving an initial value from the memory controller; and
storing the initial value in the first register.

* * * * *

UNITED STATES PATENT AND TRADEMARK OFFICE
CERTIFICATE OF CORRECTION

| | | |
|---|---|---|
| PATENT NO. | : 11,742,006 B2 | Page 1 of 1 |
| APPLICATION NO. | : 17/523778 | |
| DATED | : August 29, 2023 | |
| INVENTOR(S) | : Robert Bloemer and Gautam Bhatia | |

It is certified that error appears in the above-identified patent and that said Letters Patent is hereby corrected as shown below:

On the Title Page

Item (54) and in the Specification Column 1, Line 2 Title:
Please delete "IN".

Signed and Sealed this
Twenty-fourth Day of October, 2023

Katherine Kelly Vidal

Katherine Kelly Vidal
*Director of the United States Patent and Trademark Office*